United States Patent [19]
Schaffer

[11] Patent Number: 5,920,196
[45] Date of Patent: Jul. 6, 1999

[54] RAPID LOW VOLTAGE TESTING APPARATUS

[76] Inventor: Larry Schaffer, 5905 Magnolia La., Lakeland, Fla. 33809-6216

[21] Appl. No.: 08/833,881

[22] Filed: Apr. 10, 1997

[51] Int. Cl.$^6$ .................................................. G01R 31/02
[52] U.S. Cl. ......................... 324/537; 324/99 D; 324/133
[58] Field of Search ..................................... 324/115, 765, 324/537, 133, 99 D, 522

[56] References Cited

U.S. PATENT DOCUMENTS

| | | | |
|---|---|---|---|
| 3,990,008 | 11/1976 | Westra | 324/99 D |
| 4,578,637 | 3/1986 | Allen et al. | 324/537 |
| 5,485,095 | 1/1996 | Bertsch | 324/537 |
| 5,570,027 | 10/1996 | Stans et al. | 324/537 |
| 5,596,269 | 1/1997 | Miller | 324/537 |
| 5,608,329 | 3/1997 | Imamura | 324/537 |

*Primary Examiner*—Maura K. Regan
*Attorney, Agent, or Firm*—George A. Bode; Lisa D. Charouel; Bode & Asociates

[57] ABSTRACT

A rapid low voltage testing apparatus for detecting sequentially a plurality of electrical components of an electrical circuitry device for at least one of a plurality of predetermined low voltage levels. The rapid low voltage testing apparatus comprises a first multi-position switch having an output for sequentially outputting one of a plurality of input voltages; and a second multi-position switch having an output for sequentially outputting one of a plurality of predetermined output voltage levels which adjusts the sensitivity of a voltage detection circuit to the one of the plurality of predetermined output voltage levels. Upon a detection of a match between the first multi-position switch output and the second multi-position switch output, an indicator notifies the operator of the testing apparatus that one of the plurality of low voltage levels has been detected.

20 Claims, 3 Drawing Sheets

5,920,196

RAPID LOW VOLTAGE TESTING APPARATUS

BACKGROUND OF THE INVENTION

1. Field of the Invention

The present invention relates to a testing apparatus and, more particularly, to a rapid low voltage testing apparatus which tests sequentially a plurality of electrical components for at least one of a plurality of predetermined low voltage levels to detects rapidly trouble-shooting an electrical circuit device for faulty or malfunctioning electrical components. The detection of very low voltages is enhanced by adjusting the sensitivity of the voltage detection circuit of the testing apparatus for accurate detection of very low voltages generated by the plurality of electrical components.

2. General Background

Electrical components of electrical circuit devices often malfunction or become faulty thereby rendering the electrical circuit inoperative. Instead of discarding the electrical circuit device, it is desirable to troubleshoot the electrical circuit device by detecting low voltage levels of each electrical component thereby determining which faulty or malfunctioning electrical components need to be replaced. Moreover, when designing electrical circuit devices to operate according to design specifications, it is important to detect the operability of the electrical components of the design.

Typically, computer devices are used to sense very small voltages, with regular test lights and other type light emitting diode (LED) monitors. However, the test lights and LED monitors fail to adequately detect very small voltages because the sensitivity of the voltage detection circuits are not adjusted.

SUMMARY OF THE PRESENT INVENTION

The preferred embodiment of the apparatus of the present invention solves the aforementioned problems in a straight forward and simple manner. What is provided is a rapid low voltage testing apparatus which tests sequentially a plurality of electrical components to detect at least one of a plurality of predetermined low voltage levels for rapidly trouble-shooting an electrical circuit device for faulty or malfunctioning electrical components. The detection of very low voltages is enhanced by adjusting the sensitivity of the voltage detection circuit of the testing apparatus for accurate detection of very low voltages generated by the plurality of electrical components.

In operation, the rapid low voltage testing apparatus for testing sequentially a plurality of electrical components of an electrical circuitry device for detecting at least one low voltage level of a plurality of predetermined low voltage levels comprises:

(a) a first multi-position switch for sequentially transferring connection to an input voltage of a plurality of input voltages from a respective electrical component of the plurality of electrical components and having a first switch output for outputting said input voltage;

(b) a second multi-position switch for sequentially selecting one predetermined variable reference low voltage level of a plurality of predetermined variable reference low voltage levels and having a second switch output for outputting the selected one predetermined variable reference low voltage level;

(c) an adjustable voltage detection circuit coupled to said first switch output and said second switch output for comparing a signal indicative of said input voltage and the selected one predetermined variable reference low voltage level for detecting a predetermined low voltage level of said plurality of predetermined low voltage levels; and, (d) means for indicating coupled to said adjustable voltage detection circuit for indicating a match or greater voltage between the signal indicative of said input voltage and said selected one predetermined variable reference low voltage level.

In view of the above, it is an object of the present invention to provide a testing apparatus which is can be connected to different electrical components simultaneously whereby very low voltage levels of different electrical components are sequentially detected rapidly by switching a multi-position switch to a plurality of positions sequentially.

It is a further object of the present invention to provide such a testing apparatus having a visual indicating means for notifying an operator whether an electrical component under test is faulty or malfunctioning.

It is a further object of the invention to provide such a testing apparatus which rapidly tests an electrical component for a plurality of predetermined low voltage levels by sequentially adjusting the sensitivity of the voltage detection circuitry to the plurality of predetermined low voltage levels by switching a multi-position switch to each of the plurality of predetermined low voltage levels.

In view of the above objects it is a feature of the present invention to provide a testing apparatus which is simple to use, inexpensive and simple to manufacture.

The above objects and other features of the present invention will become apparent from the drawings, the description given herein, and the appended claims.

BRIEF DESCRIPTION OF THE DRAWING

For a further understanding of the nature and objects of the present invention, reference should be had to the following description taken in conjunction with the accompanying drawing in which like parts are given like reference numerals and, wherein.

DETAILED DESCRIPTION OF THE PREFERRED EMBODIMENT

Figure 1:
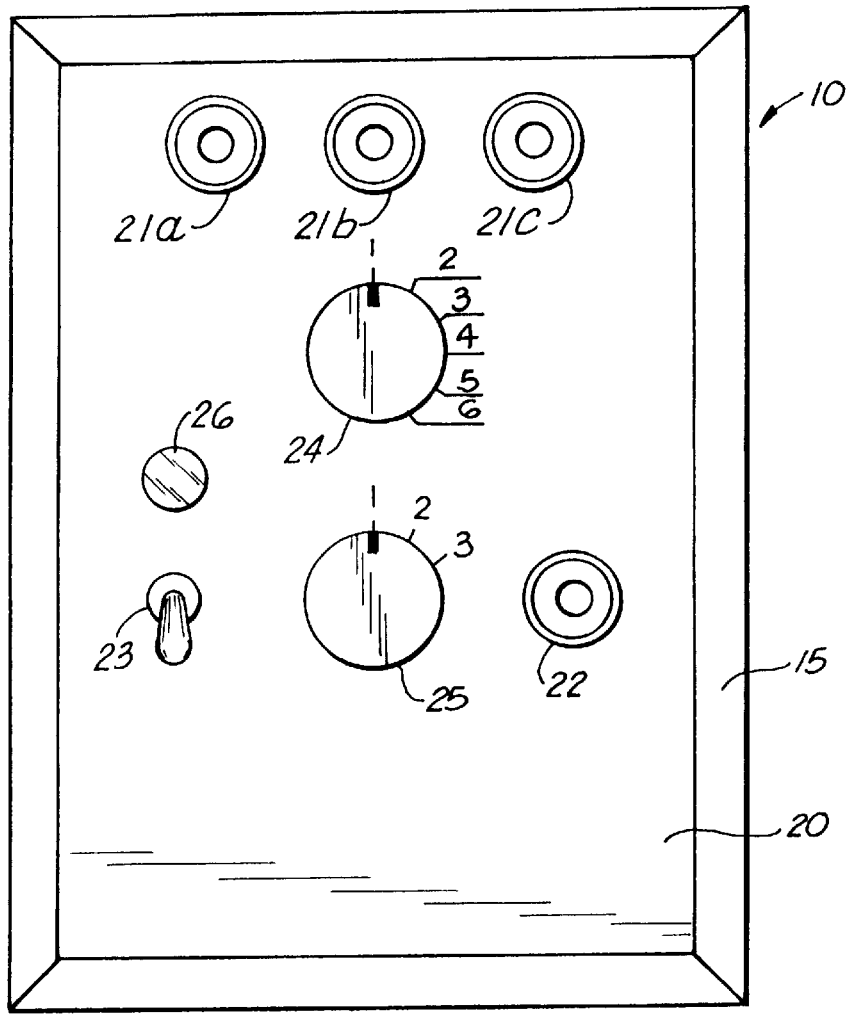
FIG. 1 is a front view of control panel and housing of the testing apparatus of the present invention.
Figure 3:
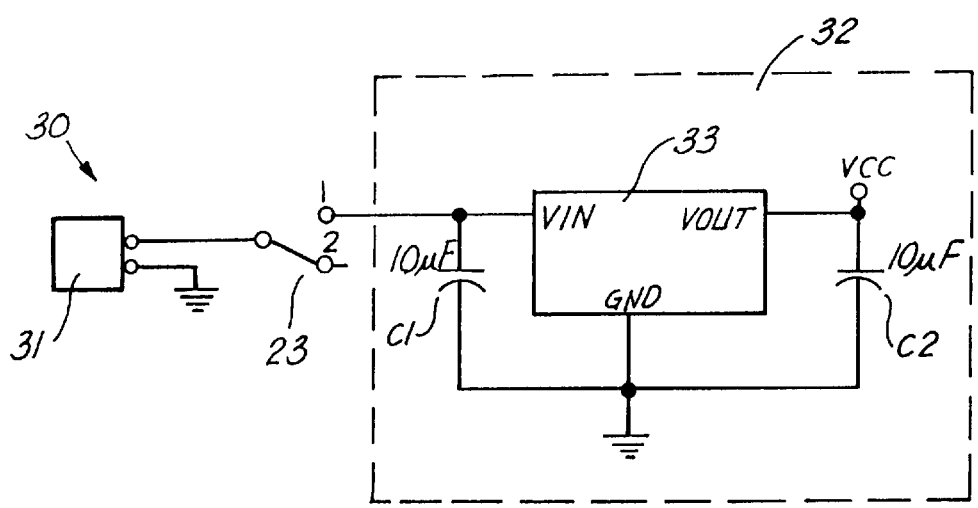
FIG. 3 is a schematic diagram of the power circuitry of the present invention.
Figure 2:
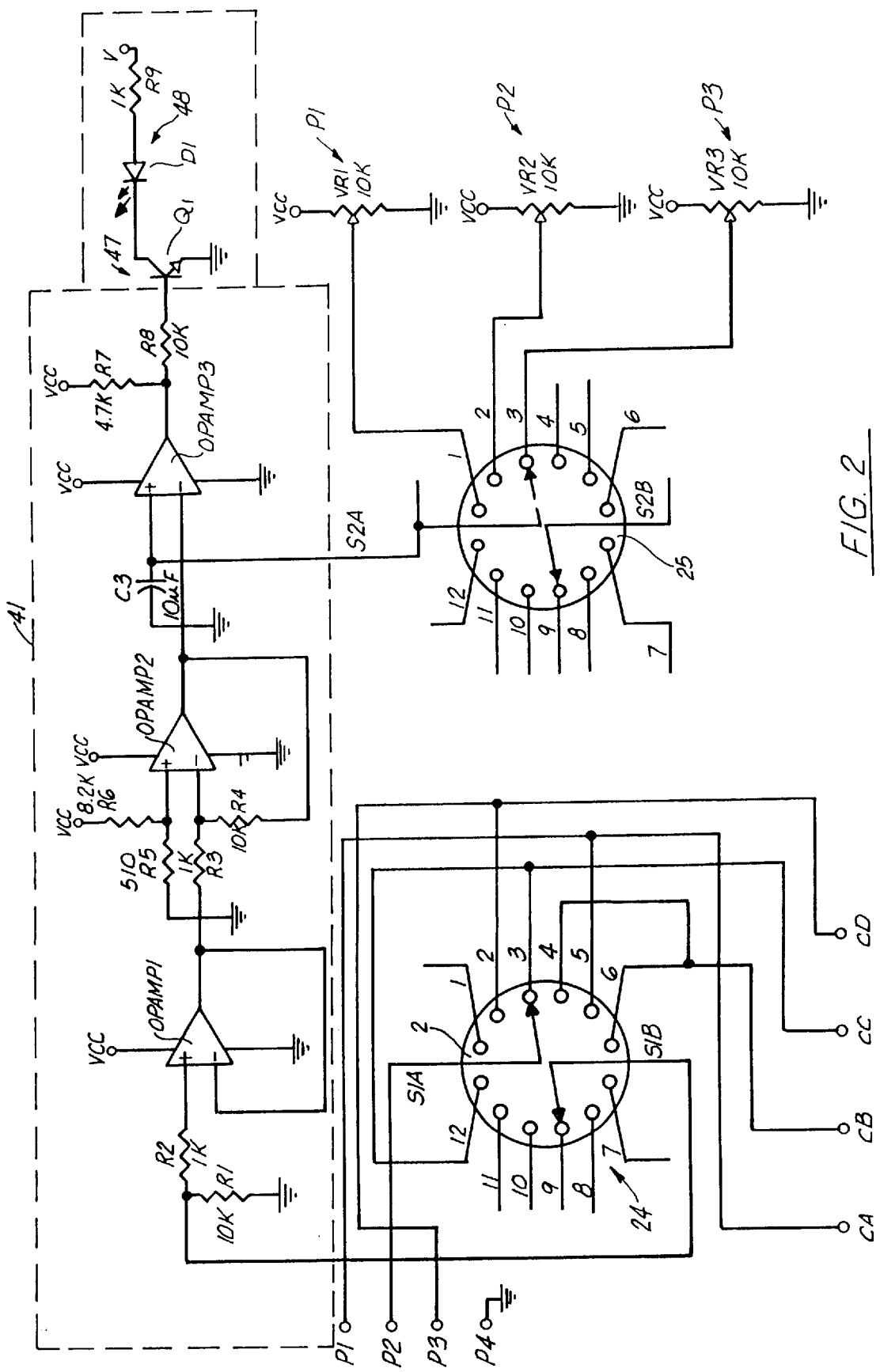
FIG. 2 is a schematic diagram of the electrical testing circuitry and indicating circuitry of the present invention.

Referring now to the drawing, and in particular FIGS. 1–3, the testing apparatus of the present invention is designated generally by the numeral 10. Testing apparatus 10 is generally comprised of housing 15, control panel 20, power circuitry 30, electrical testing circuitry 40 and indicating circuitry 45.

Referring to FIG. 1, a front view of the control panel and housing of the present invention are illustrated. Control panel 20 comprises a plurality of input jacks 21a, 21b and 21c and ground jack 22 for simultaneously electrically connecting a plurality of electrical components of an electrical circuit device (not shown) under test to testing apparatus 10 of the present invention via a plurality of lead wires (not shown). (Inputs 21 are from a user provided meter, connected to hardwire leads terminate with the device at CA, CB, CC and CD; this allows for use as a multi-meter break-out box when the test light position is not being used). Each of the plurality of lead wires has coupled thereto a different color-coded insulation piercing clip. In the exemplary embodiment, the color-coded insulation piercing clips of said plurality of lead wires are colored black, white, yellow and red for distinguishing the different electrical components being tested for at least one of a plurality of low voltage levels. Furthermore, an additional lead wire is provided for connecting ground to light emitting diode D1. The ground 22 is only for ground of the test circuit and LED, the visual indicating means 45 via ground jack 22. The plurality of input jacks 21a, 21b and 21c are push-in connection jacks used to insert an electrical plug connector from a user's meter to allow connection at will to the 9½ feet leads. Hardwired external lead wires may be 9½ feet for connection to computer controlled automobile transmissions or other electrical circuit devices.

Control panel 20 further comprises on/off switching of the LED circuit only, means 23, lead selector means 24, voltage level selector mean 25 and indicator light 26. In the exemplary embodiment, on/off switching means 23 is a toggle switch. Lead selector means 24 has six selection positions 1–6 wherein position 1 corresponds to off, position 2 corresponds to the lead wire having the black piercing clip, position 3 corresponds to the lead wire having the white piercing clip, position 4 corresponds to the lead wire having the yellow piercing clip, position 5 corresponds to the lead wire having the red piercing clip, and position 6 corresponds to the lead wires having the white and yellow piercing clips. Voltage level selector means 25 has three selection positions wherein position 1 corresponds to 0.05+ volts, position 2 corresponds to 0.15+ volts, and position 3 corresponds to 0.3+ volts.

Housing 15 houses electrical testing circuitry 40, indicating circuitry 45, power circuitry 30, a bank of spare gates 50 and bypass network 60.

Referring now to FIG. 2, a schematic diagram of the electrical testing circuitry and the indicating circuitry are illustrated. Electrical testing circuitry 40 comprises lead selector means 24 having terminals 1–12 (set to six positions) and common terminals S1A and S1B, voltage level selector means 25 and voltage detection circuitry 41. In the exemplary embodiment, lead selector means 24 and voltage level selector means 25 are non-shorting, two-pole, six position rotary switches. (Selector means 25 can function as a single pole 3-position by using the same rotaries). The following description will be directed to terminals 1–12 and common terminals S1A and S1B of lead selector means 24. Terminal 1 is open. Terminal 2 is coupled to port P3 and port CD. Terminal 3 is coupled to terminal 12 and to port CC. Terminal 4 is coupled to terminal 6 wherein both terminal 4 and 6 are coupled to port CB. Terminal 5 couples to port P1 and port CA. Terminals S1A and S1B couple to port P2 and to the input of voltage detection circuitry 41. (The "C" ports are where the external leads connect to the circuit board. CA connects to the red lead; CB connects to the yellow lead; CC connects to the white lead; and, CD connects to the black lead).

Positions 1–6 of lead selector means 24 corresponds as follows: position 1 of corresponds to terminal 7; position 2 corresponds to terminal 8; position 3 corresponds to terminal 9; position 4 corresponds to terminal 10; position 5 corresponds to terminal 11; and position 6 corresponds to terminal 12. Port P4 is coupled to ground for delivering ground to the light emitting diode D1 and voltage detector circuitry 41. Port P1 corresponds to jack 21c for coupling the voltage of the electrical circuit under test to the voltage detection circuitry 41 via the lead wire having the red piercing clip coupled thereto. Port P2 corresponds to jack 22b for coupling the voltage of the electrical circuit under test to the voltage detection circuitry 41 via the lead wire selected by switch 24. Port P3 corresponds to jack 21a for coupling the voltage of the electrical circuit under test to the voltage detection circuitry 41 via the lead wire having the black piercing clip coupled thereto. (The "P" ports are female "banana" jacks on the face of the apparatus with P1 corresponding to 21c; P2 to 21b; and, P3 to 21a. P4 corresponds to 22 and is the ground connection for the LED and voltage test).

In the exemplary embodiment, terminal 7 corresponds to off, terminal 8 corresponds to the black piercing clip, terminal 9 to the white piercing clip, terminal 10 corresponds to the yellow piercing clip, terminal 11 corresponds to the red piercing clip and terminal 12 corresponds to the combination of the white and yellow piercing clips. (Terminals 7–11 are not functional terminals).

Figure 4:
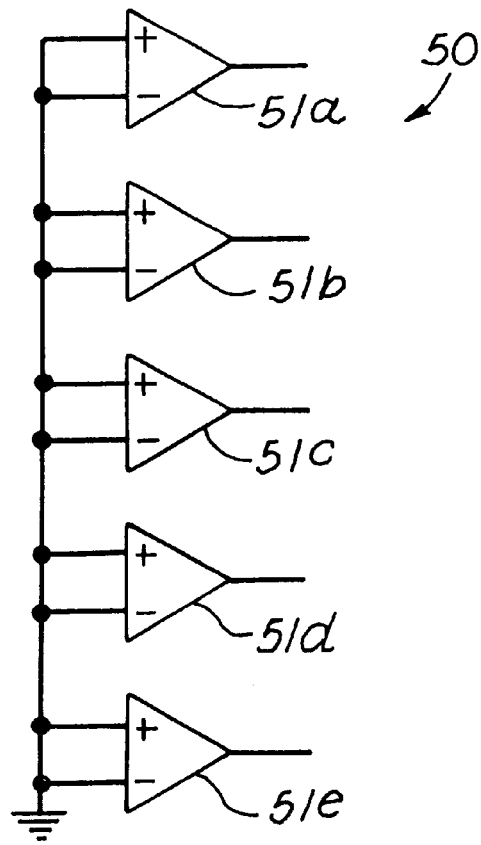
FIG. 4 is a schematic diagram of a bank of spare gates not necessarily for use in the present invention; and, FIG. 5 is a schematic diagram of a bypass network for use in the present invention.

Voltage detection circuitry 41 comprises three operational amplifiers OPAMP1, OPAMP2 and OPAMP3 cascaded together wherein OPAMP3 couples to indicating circuitry means 45. In the exemplary embodiment, operational amplifiers OPAMP1, and OPAMP2 are TLC274; operational amplifier OPAMP3 is a LM339; each with extra (unused) circuits (FIG. 4).

The non-inverting terminal of operational amplifier OPAMP1 couples to resistors R1 and R2 which form a filtering network. One terminal of R1 couples to one terminal of R2 and the other terminal of R1 couples to ground. The other terminal of R2 couples to the non-inverting terminal of operation amplifier OPAMP1. The output of operational amplifier OPAMP1 feeds back to the inverting terminal of operational amplifier OPAMP1. The output of operation amplifier OPAMP1 further couples to the inverting terminal of operation amplifier OPAMP2 via resistor R3. One terminal of resistor R3 couples to the output of operational amplifier OPAMP1 and the other terminal couples to one terminal of resistor R4. The non-inverting terminal of operational amplifier OPAMP2 couples to one terminal of resistor R6 and one terminal of resistor R5. The other terminal of resistor R5 couples to ground. The other terminal of resistor R6 couples to VCC. The output of operational amplifier OPAMP2 couples to the inverting terminal of operational amplifier OPAMP3. The non-inverting terminal of operational amplifier OPAMP3 couples to one terminal of capacitor C3 and terminal S2A of voltage level switching means 25. The other terminal of capacitor C3 couples to ground. The output of operational amplifier OPAMP3 couples to one terminal of resistor R7 and one terminal of resistor R8. The other terminal of resistor R7 couples to VCC. The other terminal of resistor R8 couples to the base of transistor Q1 of visual indicating means 45.

In the exemplary embodiment, resistors R1, R4 and R8 are 10 Kohms. Resistor 6 is 8.2 Kohms. Resistors R2, R3 and R9 are 1 Kohms. Resistors R5 and R7 are 510 ohms and 4.7 Kohms, respectively.

Voltage level selector means 25 comprises terminals 1–12 and S2A and S2B (or SIG). Terminals 4–6 and 10–12 are open. Terminal 1 couples to a potentiometer P1 having variable resistor VR1. Terminal 2 couples to potentiometer P2 having variable resistor VR2. Terminal 3 couples to potentiometer P3 having variable resistor VR3. One terminal of variable resistors VR1, VR2 and VR3 are coupled to VCC and the other terminal is coupled to ground. In the exemplary embodiment, variable resistors VR1, VR2 and VR3 are 10 Kohms.

Positions 1–3 of voltage level selector means 25 corresponds as follows: position 1 corresponds to terminal 7; position 2 corresponds to terminal 8; and position 3 corresponds to terminal 9. Terminals 7–9 are not necessary. They are only extra switch backups in case of failure of terminals 1, 2 or 3.

Indicating circuitry means 45 comprises switching means 47 and visual indicator 48. Switching means 47 comprises transistor Q1 wherein transistor Q1 is a n-p-n common-emitter transistor, such as 2N2222. The emitter of transistor Q1 is coupled to ground and the collector is coupled to the cathode of light emitting diode D1. The anode of light emitting diode D1 is coupled to one terminal of resistor R9 and the other terminal of resistor R9 is coupled to VCC wherein R9 is 1 Kohm.

The poles of switch 25 are joined as only one pole with three positions. A voltage signal is created by P1, P2 or P3 according to which on is selected. These provide adjustable reference voltages to the positive (#5 pin) of OPAMP3. When input voltage at P2 exceeds that signal voltage, then the output of OPAMP goes high and lights the LED.

Referring to FIG. 3, power circuitry means 30 comprises battery 31, on/off switching means 23, and power regulator means 32. Battery 31 is a 9 volt battery having one terminal coupled to ground and the other terminal coupled to an input of on/off switching means 23. In the exemplary embodiment, on/off switching means 23 is a toggle switch. As shown, when on/off switching means 23 is switched from the off position 2 to the on position 1, the voltage from battery 31 flows to power regulator means 32.

Power regulator means 32 comprises regulating chip 33, capacitor C1 and capacitor C2. Regulating chip 33 has an input terminal VIN, an output terminal VOUT and a ground terminal GND. Input terminal VIN couples to an output terminal of on/off switching means 23 and one terminal of capacitor C1. Output terminal VOUT is coupled to one terminal of C2 and produces an output signal VCC which is supplied to variable resistors VR1, VR2 and VR3, operational amplifiers OPAMP1, OPAMP2 and OPAMP3 and resistors R6, R7 and R9, in FIG. 2. The other terminal of C1 and C2 are coupled to ground. In the exemplary embodiment, regulating chip 33 is a LM2901. Capacitors C1 and C2 are 10 microfarads.

Referring to FIG. 4, a bank of spare gates 50 is shown. Spare gates 50 are merely excessive components within the IC chosen and are not designed to be used in the apparatus of the present invention (The ICs used have much more capacity and circuits than are needed and are merely grounded out. One bypass cap is at the input of each IC). The bank of spare gates 50 comprises a plurality of operational amplifiers 51a, 51b, 51c, 51d and 51e. The inverting and non-inverting inputs of each of the plurality of operational amplifiers 51a–51e are coupled to ground. The output of each of the plurality of operational amplifiers 51a–51e are terminated and have no purpose in the apparatus of the present invention. In the exemplary embodiment TLC274, TLC274, LM339, LM339, LM339.

Figure 5:
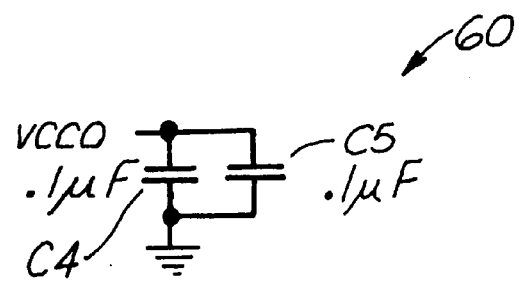

Referring to FIG. 5, rapid low voltage testing apparatus 10 further comprises bypass network 60. Bypass network 60 comprises capacitors C4 and C5 coupled in parallel wherein one terminal of capacitors C4 and C5 are coupled to VCC and the other terminal of capacitors C4 and C5 is coupled to ground. They are placed at the VCC input of LM339 and TLC 274 for filtering and stability of voltage. In the exemplary embodiment, C4 and C5 are 0.1 microfarads.

The following description will be referring to testing procedure of the testing apparatus 10 of the present invention. Since describing the test procedures for all lead wires is prohibitive, a description of the procedure for a lead wire is provided below. The plurality of lead wires (not shown) are connected to testing apparatus 10 via the plurality of input jacks 21a, 21b, 21c. At least one of the plurality of lead wires are connected to an electrical component of an electrical circuit device. Therefore, the present invention allows a plurality of electrical components to be simultaneously coupled to testing apparatus 10 of the present invention. Voltage level selector means 25 is set on any of the plurality of predetermined low voltage levels desired to be detected. If light emitting diode D1 illuminates, then the selected voltage level minimum within the electrical component circuit has been detected. Otherwise, voltage level selector means 25 may then be sequentially switched to a different one of the plurality of predetermined low voltage levels. Accordingly, light emitting diode D1 will illuminate in the event a match or higher voltage is found between a signal indicative of an input voltage of a tested electrical component and one of the selected predetermined low voltage levels.

Lead selector means 24 may then be sequentially switched to any other of the other plurality of lead wires for testing other electrical components of the electrical circuit device.

Apparatus 10 can also serve as a multi-meter break-out box when means 23 is off. Patch cords (banana plug on each end) are provided to connect a meter to input jacks 21a, 21b or 21c. Predetermined connection of the four colored clips along with the ability to ground the meter separately, will allow a user's meter to switch connection rapidly, thus serving as four meters. It can be used to sense anything that a meter will sense, as it is merely a junction box for multiple hook-ups and quickly can be used to compare readings for testing.

Because many varying and differing embodiments may be made within the scope of the inventive concept herein taught and because many modifications may be made in the embodiment herein detailed in accordance with the descriptive requirement of the law, it is to be understood that the details herein are to be interpreted as illustrative and not in a limiting sense.

What is claimed as invention is:

1. A rapid low voltage testing apparatus for testing sequentially a plurality of electrical components of an electrical circuitry device for detecting at least one low voltage level of a plurality of predetermined low voltage levels, said rapid low voltage testing apparatus comprising:

(a) a first multi-position switch for sequentially transferring connection to an input voltage of a plurality of input voltages from a respective electrical component of the plurality of electrical components and having a first switch output for outputting said input voltage;

(b) a second multi-position switch for sequentially selecting one predetermined variable reference low voltage level of a plurality of predetermined variable reference low voltage levels and having a second switch output for outputting the selected one predetermined variable reference low voltage level;

(c) an adjustable voltage detection circuit coupled to said first switch output and said second switch output for comparing a signal indicative of said input voltage and the selected one predetermined variable reference low voltage level for detecting a predetermined low voltage level of said plurality of predetermined low voltage levels; and, (d) means for indicating coupled to said adjustable voltage detection circuit for indicating a match or greater voltage between the signal indicative of said input voltage and said selected one predetermined variable reference low voltage level.

2. The apparatus of claim 1, wherein said first multi-position switch and said second multi-position switch are non-shorting, two-pole, six position rotary switches.

3. The apparatus of claim 1, wherein said means for indicating comprises a visual indicator.

4. The apparatus of claim 1, wherein said adjustable voltage detection circuit comprises:

i) a first operational amplifier having an input coupled to said first switch output and an output;

ii) a second operational amplifier having an input coupled to said output of said first operational amplifier and an output; and iii) a third operational amplifier having a first input coupled to said second switch output, a second input coupled to said output of said second operational amplifier and an output wherein the output of said third operation amplifier is a signal indicative of whether said match or said greater voltage between the signal indicative of said input voltage and said one predetermined variable reference low voltage level has been detected.

5. The apparatus of claim 4, wherein said means for indicating comprises a visual indicator and a means for switching said visual indicator on in response to said adjustable voltage detection circuit detecting said match or said greater voltage.

6. The apparatus of claim 5, wherein said switching means is a n-p-n transistor having a base coupled to said output of said third operational amplifier and a collector coupled to the visual indicator.

7. The apparatus of claim 1, wherein said second multi-position switching means comprises:

i) a first position coupled to a first potentiometer wherein said first potentiometer produces a signal indicative of a first predetermined variable reference low voltage level of said plurality of predetermined variable reference low voltage levels;

ii) a second position coupled to a second potentiometer wherein said second potentiometer produces a signal indicative of a second predetermined variable reference low voltage level of said plurality of predetermined variable reference low voltage levels; and iii) a third position coupled to a third potentiometer wherein said third potentiometer produces a signal indicative of a third predetermined variable reference low voltage level of said plurality of predetermined variable reference low voltage levels.

8. A rapid low voltage testing apparatus for testing sequentially a plurality of electrical components of an electrical circuitry device for detecting at least one low voltage level of a plurality of predetermined low voltage levels, said rapid low voltage testing apparatus comprising:

(a) a first switching means for sequentially transferring connection to an input voltage of a plurality of input voltages from a respective electrical component of the plurality of electrical components and having a first switch output for outputting said input voltage;

(b) a second switching means for sequentially selecting one predetermined reference low voltage level of a plurality of predetermined reference low voltage levels and having a second switch output for outputting the selected one predetermined reference low voltage level;

(c) an adjustable means for voltage detection coupled to said first switch output and said second switch output for comparing a signal indicative of said input voltage and the selected one predetermined reference low voltage level for detecting a predetermined low voltage level of said plurality of predetermined low voltage levels wherein said second switch output adjusts the sensitivity of said adjustable voltage detection means; and, (d) means for indicating coupled to said adjustable voltage detection means for indicating a minimum or greater voltage between the signal indicative of said input voltage and said selected one predetermined reference low voltage level.

9. The apparatus of claim 8, wherein said first switching means and said second switching means are non-shorting, two-pole, six position rotary switches.

10. The apparatus of claim 8, wherein said means for indicating comprises a visual indicator.

11. The apparatus of claim 8, wherein said adjustable voltage detection means comprises:

i) a first operational amplifier having an input coupled to said first switch output and an output;

ii) a second operational amplifier having an input coupled to said output of said first operational amplifier and an output; and iii) a third operational amplifier having a first input coupled to said second switch output, a second input coupled to said output of said second operational amplifier and an output wherein the output of said third operation amplifier is a signal indicative of whether said minimum or said greater voltage between the signal indicative of said input voltage and said one predetermined reference low voltage level has been detected.

12. The apparatus of claim 11, wherein said means for indicating comprises a visual indicator and a means for switching said visual indicator on in response to said adjustable voltage detection means detecting said minimum or said greater voltage.

13. The apparatus of claim 12, wherein said switching means of said means for indicating is a n-p-n transistor having a base coupled to said output of said third operational amplifier and a collector coupled to the visual indicator.

14. The apparatus of claim 8, wherein said second switching means comprises:

i) a first position coupled to a first potentiometer wherein said first potentiometer produces a signal indicative of a first predetermined reference low voltage level of said plurality of predetermined reference low voltage levels;

ii) a second position coupled to a second potentiometer wherein said second potentiometer produces a signal indicative of a second predetermined reference low voltage level of said plurality of predetermined reference low voltage levels; and iii) a third position coupled to a third potentiometer wherein said third potentiometer produces a signal indicative of a third predetermined reference low voltage level of said plurality of predetermined reference low voltage levels.

15. A rapid low voltage testing apparatus for testing sequentially a plurality of electrical components of an electrical circuitry device for detecting at least one of a plurality of predetermined low voltage levels, said rapid low voltage testing apparatus comprising:

(a) a first switching means for sequentially transferring connection to an input voltage of a plurality of input voltages from a respective electrical component of the plurality of electrical components and having a first switch output for outputting said input voltage;

(b) a second switching means for sequentially selecting one predetermined reference low voltage level of a plurality of predetermined reference low voltage levels and having a second switch output for outputting the selected one predetermined reference low voltage level;

(c) an adjustable means for voltage detection, coupled to said first switch output and said second switch output, for detecting said plurality of predetermined low voltage levels wherein said second switch output adjusts the sensitivity of said adjustable voltage detection means, said adjustable voltage detection means comprises:

i) a first operational amplifier having an input coupled to said first switch output and an output, ii) a second operational amplifier having an input coupled to said output of said first operational amplifier and an output, and iii) a third operational amplifier having a first input coupled to said second switch output, a second input coupled to said output of said second operational amplifier and an output wherein the output of said third operation amplifier is a signal indicative of whether a match between the signal indicative of said input voltage and said one predetermined reference low voltage level has been detected; and, (d) means for indicating coupled to said adjustable voltage detection circuit for indicating said match between the signal indicative of said input voltage and said selected one predetermined reference low voltage level.

16. The apparatus of claim 15, wherein said first switching means and said second switching means are non-shorting, two-pole, six position rotary switches.

17. The apparatus of claim 15, wherein said means for indicating comprises a visual indicator.

18. The apparatus of claim 15, wherein said means for indicating comprises a visual indicator and a means for switching said visual indicator on in response to said adjustable voltage detection means detecting said match.

19. The apparatus of claim 18, wherein said switching means of said means for indicating is a n-p-n transistor having a base coupled to said output of said third operational amplifier and a collector coupled to the visual indicator.

20. The apparatus of claim 15, wherein said second switching means comprises:

i) a first position coupled to a first potentiometer wherein said first potentiometer produces a signal indicative of a first predetermined reference low voltage level of said plurality of predetermined reference low voltage levels;

ii) a second position coupled to a second potentiometer wherein said second potentiometer produces a signal indicative of a second predetermined reference low voltage level of said plurality of predetermined reference low voltage levels; and iii) a third position coupled to a third potentiometer wherein said third potentiometer produces a signal indicative of a third predetermined reference low voltage level of said plurality of predetermined reference low voltage levels.

* * * * *